(12) United States Patent
Eusebi et al.

(10) Patent No.: US 11,035,663 B2
(45) Date of Patent: Jun. 15, 2021

(54) SYSTEMS AND METHODS FOR CHARACTERIZING PHYSICAL PHENOMENA

(71) Applicant: The Texas A&M University System, College Station, TX (US)

(72) Inventors: Ricardo Eusebi, College Station, TX (US); Jeffrey Breitschopf, College Station, TX (US); David Andrew Overton, College Station, TX (US); Brian Muldoon, San Antonio, TX (US); Sifu Luo, College Station, TX (US); Zhikun Xing, Mountain View, CA (US)

(73) Assignee: The Texas A&M University System, College Station, TX (US)

( * ) Notice: Subject to any disclaimer, the term of this patent is extended or adjusted under 35 U.S.C. 154(b) by 0 days.

(21) Appl. No.: 16/547,423

(22) Filed: Aug. 21, 2019

(65) Prior Publication Data

US 2020/0064120 A1 Feb. 27, 2020

Related U.S. Application Data

(60) Provisional application No. 62/720,685, filed on Aug. 21, 2018.

(51) Int. Cl.
*G01B 11/00* (2006.01)
*G01B 11/02* (2006.01)
*G01B 11/04* (2006.01)
*G01B 21/04* (2006.01)

(52) U.S. Cl.
CPC .......... *G01B 11/005* (2013.01); *G01B 11/022* (2013.01); *G01B 11/04* (2013.01); *G01B 21/045* (2013.01); *G01B 21/047* (2013.01)

(58) Field of Classification Search
CPC ...... G01B 11/005; G01B 11/022; G01B 11/04
USPC ....................................................... 348/135
See application file for complete search history.

(56) References Cited

U.S. PATENT DOCUMENTS

2011/0299738 A1* 12/2011 Wieneke ................. G01P 5/001
382/107

* cited by examiner

*Primary Examiner* — Jeffery A Williams
(74) *Attorney, Agent, or Firm* — Conley Rose, P.C.

(57) ABSTRACT

Systems and related methods are disclosed for characterizing physical phenomena. In an embodiment, the system includes a frame defining an active volume, a camera configured to capture an image of the active volume, and a controller coupled to the camera. In an embodiment, the controller is configured to: track an object within the active volume via the camera, analyze a motion of the object within the active volume, and output a visual depiction of the object and one or more vectors characterizing the motion of the object on a display.

18 Claims, 8 Drawing Sheets

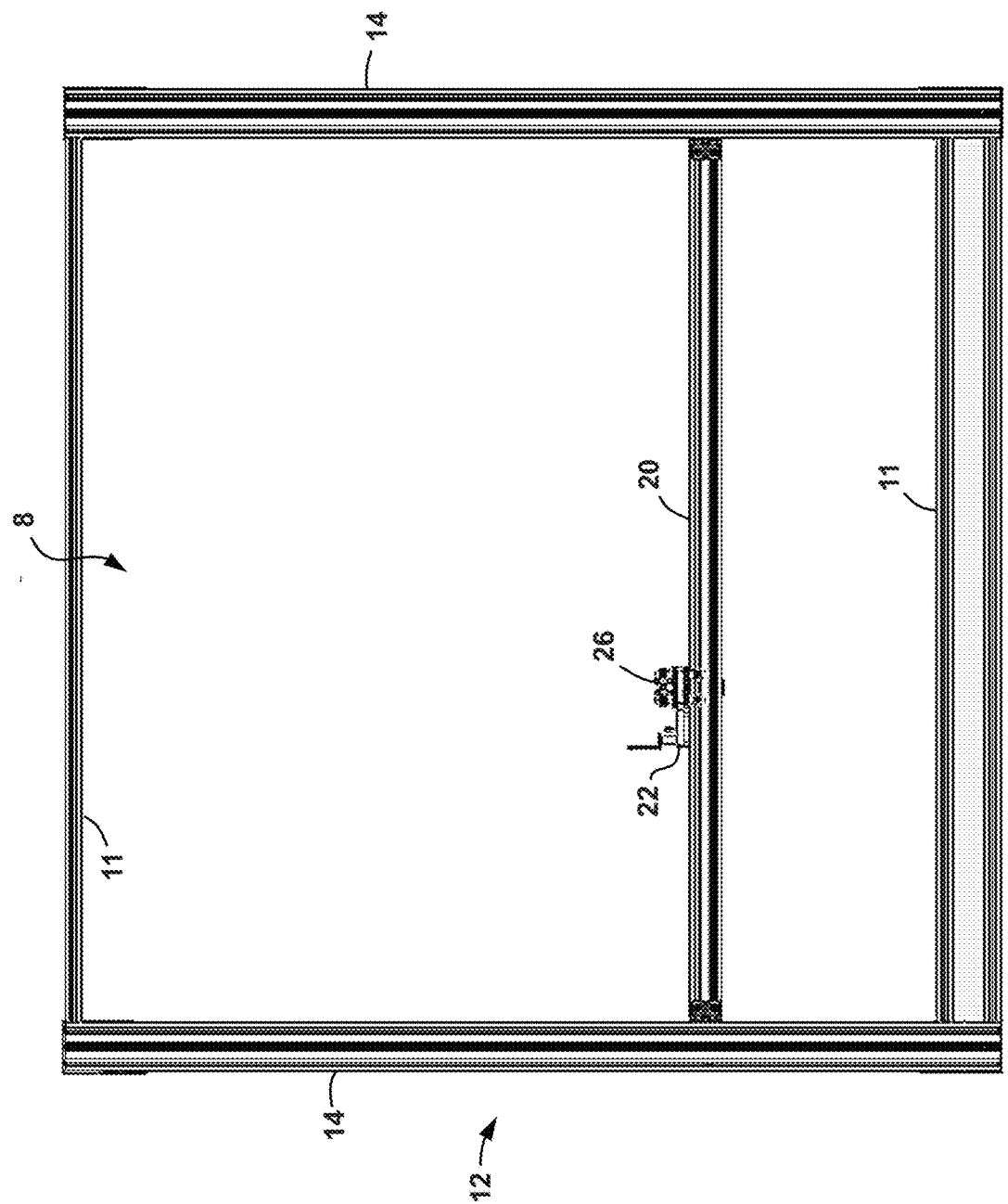

SYSTEMS AND METHODS FOR CHARACTERIZING PHYSICAL PHENOMENA

CROSS-REFERENCE TO RELATED APPLICATIONS

This application claims benefit of U.S. provisional patent application Ser. No. 62/720,685 filed Aug. 21, 2018, and entitled "Experimental Vision, Motion, and Data Framework," which is hereby incorporated herein by reference in its entirety.

STATEMENT REGARDING FEDERALLY SPONSORED RESEARCH OR DEVELOPMENT

Not applicable.

BACKGROUND

The physics of motion, force transfer, electricity, and magnetism, as well as other physical phenomena are often difficult to conceptualize and understand. The difficulty typically derives from an individual's inability to visualize these often unperceivable and even sometimes non-intuitive concepts. Accordingly, those faced with the task of teaching or explaining these phenomena may encounter challenges in presenting the subject matter in a way that informs and overcomes the above noted difficulties.

BRIEF SUMMARY

Some embodiments disclosed herein as directed to a system for characterizing physical phenomena. In an embodiment, the system includes a frame defining an active volume, a camera configured to capture an image of the active volume, and a controller coupled to the camera. The controller is configured to track an object within the active volume via the camera, analyze a motion of the object within the active volume, and output a visual depiction of the object and one or more vectors characterizing the motion of the object on a display.

In other embodiments, the system includes a frame defining an active volume, a camera configured to capture an image of the active volume, and a sensor mounted to the frame. In addition, the system includes a coordinate-measuring machine (CMM) coupled to the frame that is configured to move the sensor within the active volume. Further, the system includes a controller coupled to the camera, the CMM, and the sensor. The controller is configured to move the sensor within the active volume via the CMM, detect one of a magnetic or an electric field within the active volume via the sensor, and output a visual depiction of the one of the magnetic or the electric field on a display.

Other embodiments disclosed herein are directed to a method of characterizing physical phenomena. In an embodiment, the method includes moving an object within an active volume, wherein the active volume is defined by a frame. In addition, the method includes tracking the object with a camera. Further, the method includes displaying a visual depiction of the object that includes one or more vectors characterizing a motion of the object within the active volume.

Embodiments described herein comprise a combination of features and characteristics intended to address various shortcomings associated with certain prior devices, systems, and methods. The foregoing has outlined rather broadly the features and technical characteristics of the disclosed embodiments in order that the detailed description that follows may be better understood. The various characteristics and features described above, as well as others, will be readily apparent to those skilled in the art upon reading the following detailed description, and by referring to the accompanying drawings. It should be appreciated that the conception and the specific embodiments disclosed may be readily utilized as a basis for modifying or designing other structures for carrying out the same purposes as the disclosed embodiments. It should also be realized that such equivalent constructions do not depart from the spirit and scope of the principles disclosed herein.

BRIEF DESCRIPTION OF THE DRAWINGS

For a detailed description of various exemplary embodiments, reference will now be made to the accompanying drawings in which:

FIG. 8 is a top view of the frame of the system of FIG. 1.

DETAILED DESCRIPTION

Figure 1:
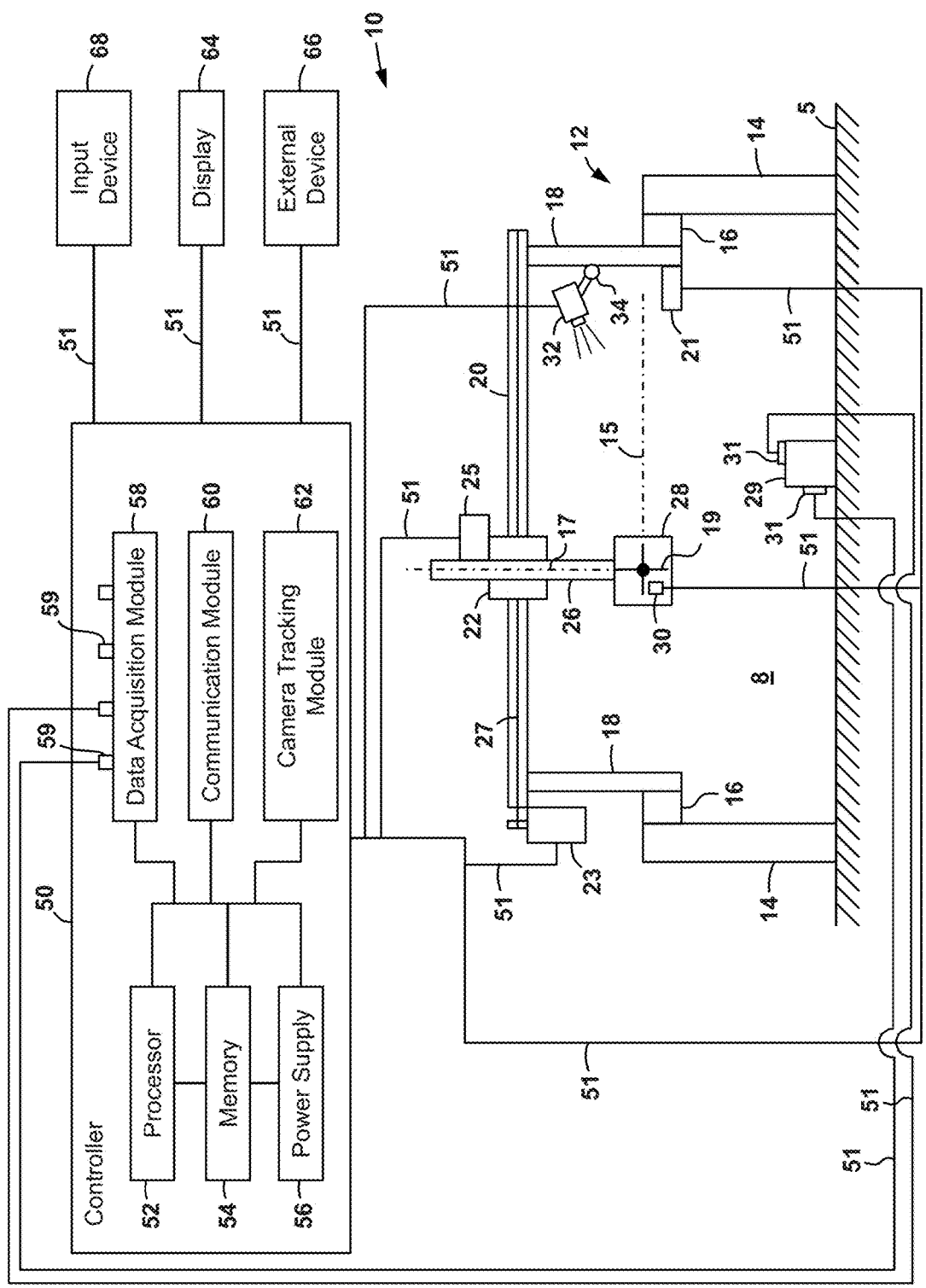
FIG. 1 is a schematic view of an embodiment of system for characterizing physical phenomena in accordance with principles described herein.

The following discussion is directed to various exemplary embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection of the two devices, or through an indirect connection that is established via other devices, components, nodes, and connections. In addition, as used herein, the terms "axial" and "axially" generally mean along or parallel to a given axis (e.g., central axis of a body or a port), while the terms "radial" and "radially" generally mean perpendicular to the given axis. For instance, an axial distance refers to a distance measured along or parallel to the axis, and a radial distance means a distance measured perpendicular to the axis. Further, when used herein (including in the claims), the words "about," "generally," "substantially," "approximately," and the like mean within a range of plus or minus 10%.

As previously described, various physical phenomena (e.g., the physics of motion, force transfer, electricity, and magnetism, etc.) may be difficult to conceptualize and understand. Accordingly, embodiments disclosed herein are directed to systems and methods for characterizing physical phenomena so as to address the above noted challenges. In general, the "physical phenomena" that can be characterized by embodiments disclosed herein include, without limitation, acceleration and velocity (including linear and angular acceleration and velocity), electricity, magnetism, force(s), strain, etc. for physical structures, objects, etc.

Referring now to FIG. 1, an embodiment of a system 10 for characterizing physical phenomena is schematically shown. In this embodiment, system 10 generally includes a frame 12 disposed on a support surface 5 and a controller 50 coupled to the frame 12. In general, the support surface 5 can be provided by any static, stable structure such as a slab, floor, table, countertop, etc.

Frame 12 includes a base including a pair of base members 14 disposed atop support surface 5. The base members 14 are laterally-spaced from one another along support surface 5 so as to define an active volume or space 8 therebetween. In addition, frame 12 includes a plurality of frame members coupled to and supported by base members 14. Specifically, in this embodiment, frame 12 includes a pair of rails 16 mounted to base members 14 and a pair of vertical support members 18 movably coupled to rails 16, and an upper support member 20 coupled to and extending between the vertical support members 18. One rail 16 is mounted to each base member 14, and one vertical support member 18 is movably coupled to one rail 16.

A trolley or cart 22 is movably disposed along the upper support member 20, and a vertical rail 26 is movably coupled to cart 22. A probe 28 is mounted to vertical rail 26. As will be described in more detail below, probe 28 supports one or more sensors 30 for measuring or detecting a plurality of parameters (e.g., force, acceleration, velocity, voltage, electrical current, magnetism, momentum, etc.) within the active volume 8.

Generally speaking, during operations probe 28 can move within the three dimensional active volume 8 along three orthogonal coordinate axes 15, 17, 19 (note: axis 19 is shown extending normally to the page in the view of FIG. 1). In some embodiments (e.g., such as the embodiment of FIG. 1), axis 17 is a vertically oriented axis (i.e., an axis this aligned with the direction of gravity), and axes 15, 19 are laterally or horizontally oriented axes that form a plane that is generally orthogonal to the direction of gravity. However, in other embodiments, such alignment of the axes 15, 17, 19 to the vertical and horizontal directions does not occur. During operations, probe 28 can move parallel to axis 19 by translation of the vertical support members 19 along rails 16 mounted to base members 14, probe 28 can move parallel to axis 15 by movement of cart 22 along upper support member 20, and probe 28 can move parallel to axis 17 by movement of vertical rail 26 relative to cart 22.

Referring still to FIG. 1, a plurality of motors or drivers are coupled to the frame 12 so as to drive the movement of the probe 28 in the axes 15, 17, 19 as described above. For instance, in this embodiment, system 10 includes a first driver 21 to actuate vertical support members 18 along rails 16, a second driver 23 to actuate cart 22 along upper support member 20, and a third motor 25 to actuate vertical rail 26. In general, each driver 21, 23, 25 can be any suitable driver or motor known in the art such as, for instance, electric motors (e.g., servomotors, stepper motors, etc.), hydraulic motors, pneumatic motors, etc. In this embodiment, drivers 21, 23, 25 are electric motors. In addition, any suitable transmission or coupling can be utilized with drivers 21, 23, 25 to affect the above described movements/translations during operations. For instance, in some embodiments, one or both of the rails 26 include a rack that is meshed with a pinion gear coupled to an output shaft of driver 21. In addition, an elongate chain 27 (or belt, or other suitable member) may be disposed about upper support member 20 and coupled to an output shaft of second driver 23 and cart 22. Thus, during operations, actuation of second driver 23 may actuate the chain 27 to thereby move cart 22 along upper support member 20 as previously described above. Further, vertical rail 26 may include a rack gear that meshes with a pinion coupled to an output shaft of third driver 25 in a manner similar to that mentioned above for rails 26 and first driver 21. Thus, during operations, actuation of third driver 25 may cause displacement of vertical rail 26 along axis 17 as previously described above. However, it should be appreciated that different couplings and transmission mechanisms may be utilized within other embodiments of system 10 to affect the above described motions of vertical support members 18, cart 22, vertical rail 26, via drivers 21, 23, 25, respectively. Together, the drivers 21, 23, 25 and frame 12 (e.g., including rails 16, vertical support members 18, upper support member 20, cart 22, and vertical rail 26) define a coordinate-measuring machine (CMM) configured to maneuver probe 28 about active volume 8 during operations.

A camera 32 is secured to frame 12 via an actuatable mount 34. In particular, in this embodiment, camera 32 is secured to one of the vertical support members 18 via mount 34; however, in general, camera 32 can be secured to frame 12 in any suitable location (e.g., along base members 14, upper support member 20, vertical rail 26, probe 28, etc.). In some embodiments, camera 32 is not be mounted to frame 12 at all, and is instead be mounted adjacent to frame 12 on a separate support structure.

During operations, camera 32 takes images (e.g., still images, video, etc.) of probe 28 and/or other objects within active volume 8 (e.g., such as object 29 shown in FIG. 1). Actuatable mount 34 may include a plurality of joints that allow camera 32 to be moved in a variety of directions and orientations so as to align the view of camera 32 with the object(s) of interest (e.g., probe 28, object 29, etc.) regardless of the position of the corresponding object within active volume 8. For instance, mount 34 may be configured to adjust a pitch, yaw, roll, or combinations thereof of the camera 32 during operations. In addition, in some embodiments, mount 34 is motorized or actuatable such that actuation or movement of camera 32 in the plurality of directions or orientations is driven by another device (e.g., controller 50). In some embodiments, camera 32 is fixed in its orientation or view with respect to active volume 8 (e.g., such that actuatable mount 34 is not included).

Referring still to FIG. 1, controller 50 may comprise a single integrated component or a plurality of coupled components or members. Generally speaking, in some embodiments, controller 50 comprises a processor 52, a memory 54, a power supply 56, a data acquisition module 58, a communication module 60, and a camera tracking module 62.

The processor 52 (e.g., microprocessor, central processing unit, or collection of such processor devices, etc.) executes machine readable instructions (e.g., non-transitory machine readable instructions) provided on memory 54 to provide the processor 52 with all of the functionality described herein. The memory 54 may comprise volatile storage (e.g., random access memory), non-volatile storage (e.g., flash storage, read only memory, etc.), or combinations of both volatile and non-volatile storage. Data consumed or produced by the machine readable instructions can also be stored on memory 54.

In general, the power supply 56 can be any suitable source of electrical power such as, for example, a battery, capacitor, a converter or transformer, wall plug, breaker box, etc. In some embodiments power source 56 is a power supply unit (PSU) that receives electrical power from a source (e.g., wall plug, batter, etc.), and delivers electrical current to the various components of controller 50.

The data acquisition module 58 can be any device and/or application that receives output signals from one or more sensors, such as, for instance, sensors mounted to probe 28 (e.g., sensor 30) and/or sensors positioned within or on objects disposed within active volume (e.g., sensors 31 on object 29). Data acquisition module 58 may comprise a standalone component that is separate from processor 52 or may be integrated (partially or wholly) within processor 52. In some embodiments, data acquisition module 58 comprises a plurality of ports 59 that couple data acquisition module 58 to the one or more sensors (e.g., sensors 30, 31). Data obtained from the sensors via data acquisition module 58 may then be communicated to other components within and/or coupled to controller 50. For instance, in some embodiments, data obtained from the sensor coupled to data acquisition module 58 are provided to processor 52 for additional processing and/or presented on a separate display (e.g., such as display 64 described in more detail below).

In the embodiment of FIG. 1, an object 29 is shown in active volume 8 that includes a plurality of sensors 31 mounted thereto. In general, object 29 may be any structure, object, etc. (e.g., such as a model of a bridge, building, etc. or a ball, plate, etc.). In some embodiments, sensors 31 are strain gauges or other suitable sensors. During operations, sensors 31 provide output signals that are indicative of a measured value (e.g., strain) to data acquisition module 58 via communication paths 51. Communication paths 51 can be any suitable physical (e.g., cable, wire, lead, conductive trace, etc.) and/or wireless (e.g., WIFI, radio frequency (RF) communication, BLUETOOTH®, infrared, etc.) connection. In some embodiments, communication paths 51 are cables or wires that are coupled to data acquisition module at the one or more ports 59. Once the data from sensors 31 is obtained (e.g., at data acquisition module 58), it is then be provided to processor 52 for additional processing as previously described above.

Communication module 60 may comprise port(s), antenna(s), and/or other communication devices that communicate with other devices, such as other electronic devices. For instance, communication module 60 can be used by controller 50 to communicate with a display 64, an external device 66, an input device 68, etc. The external device 66 comprises one or more other electronic devices, such as, for instance computers (e.g., desktop computers, laptop computers, tablets, smartphones, etc.), servers, etc. Display 64 may comprise any suitable display (e.g., liquid crystal display, plasmas display, light emitting diode display, etc.). Controller 50 (e.g., specifically communication module 60) is coupled to display 24, external device(s) 66 via one or more communication paths 51. In some embodiments, communication module 60 communicates with external device(s) 66 via a network (e.g., the internet, one or more intranets, a cellular network, etc.). As a result, display 64 and external device(s) 66 may be proximate to or remote from frame 12 and/or controller 50 during operations. In some embodiments communication module 60 comprises (at least partially) machine readable instructions that are stored on memory 54 and executed by processor 52 during operations.

Camera tracking module 62 may comprise any device and/or application (including machine readable instructions) that targets and tracks an object or a plurality of objects via an associated camera system (e.g., camera 32). For instance, in this embodiment, camera tracking module 62 may target and track an object (e.g., probe 28, object 29, etc.) via camera 32. In addition, camera tracking module 62 can actuate camera 32 via mount 34 so as to track an object (e.g., probe 28, object 29) as it moves within the active volume 8. Thus, as shown in FIG. 1, camera 32 may be coupled to controller 50 (e.g., to camera tracking module 62) via a communication path 51. In some embodiments, camera tracking module 62 comprises (at least partially) machine readable instructions that are stored on memory 54 and executed by processor 52 during operations.

In some embodiments, camera tracking module 62 tracks one or more moving objects within active volume 8 such that analysis can be performed to characterize the motion of the objects (e.g., linear and/or angular acceleration and velocity, momentum, rotation, etc.). The results of this analysis may then be visually presented on a separate display (e.g., such as the display 64 and/or a display of the external device 66). In some embodiments, camera tracking module 62 both tracks and analyzes the motion of the one more objects within active volume 8. In other embodiments, camera tracking module 62 tracks the moving object(s) and then other components within or coupled to controller 50 (e.g., processor 52, external device 66, etc.) perform the additional analysis to characterize the motion of the one or more objects.

In some embodiments, camera tracking module 62 tracks one or more objects via camera 32 within active volume 8 that have a corresponding marker attached thereto. For instance, in some embodiments, suitable markers include reflective stickers that are attached to an outer surface of the one or more objects, and the camera module 62, via camera 32, target the markers and then track the objects that these markers are attached to during operations.

As used herein, the "tracking" of an object by camera tracking module 62 may comprise moving the camera 32 (e.g., via mount 34) to maintain view of the object (e.g., on display 64, and/or on a display of external device 66, etc.). In other embodiments, "tracking" of an object by camera tracking module 62 may comprise maintaining camera 32 in a fixed position, and tracking or tracing a movement of the object across the view of the camera 32. In still other embodiments, "tracking" of an object by camera tracking module 62 may comprise a combination of the above described tracking modes.

Input device 68 may be coupled to or incorporated within controller 50 and is configured to receive user inputs during operations. As previously described above, the user inputs received at input device 68 are utilized by controller 50 to actuate or control various other components of system (e.g., drivers 21, 23, 25, modules 58, 60, 62, camera 32, etc.). In some embodiments, input device 68 includes a keyboard, a touch sensitive surface, mouse, etc. In addition, in some embodiments, input device 68 includes a touch sensitive sensor integrated or included within display 64. In addition, in some embodiments, input device 68 includes a plurality of input devices (e.g., such as those described above) for receiving inputs from a user during operations. In still other embodiments, user inputs to controller 50 are received from external device 66 via communication module 60 either in addition to or in lieu of inputs from input device 68.

Controller 50 is coupled to each of the drivers 21, 23, 25 via communication paths 51. During operations, processor 52 issues commands to drivers 21, 23, 25 so as to move probe 28 to a desired location within active volume 8 and/or to induce a desired motion to probe 28 within active volume 8 during operations. The desired motion and/or position of probe 28 is determined by machine readable instructions (e.g., machine readable instructions stored on memory 54 and executed by processor 52) and/or by user inputs (e.g., such as inputs received from user at input device 68, external device 66, etc.).

As previously described above, system 10 is used to characterize physical phenomena, such as physical phenomena associated with objects disposed within the active volume 8. A number of particular examples of physical phenomenon that may be studied utilizing system 10 will now be described below with reference to FIGS. 2-4; however, these specific examples should not be interpreted as limiting the potential uses of the system 10 or as limiting the physical phenomena that may be studied utilizing system 10. In addition, it should be appreciated that the depictions of system 10 in FIGS. 2-4 may not illustrate all of the components of system 10 shown in FIG. 1 and/or discussed above. Thus, continuing reference is also made to FIG. 1 throughout the discussion of these particular examples.

Figure 2:
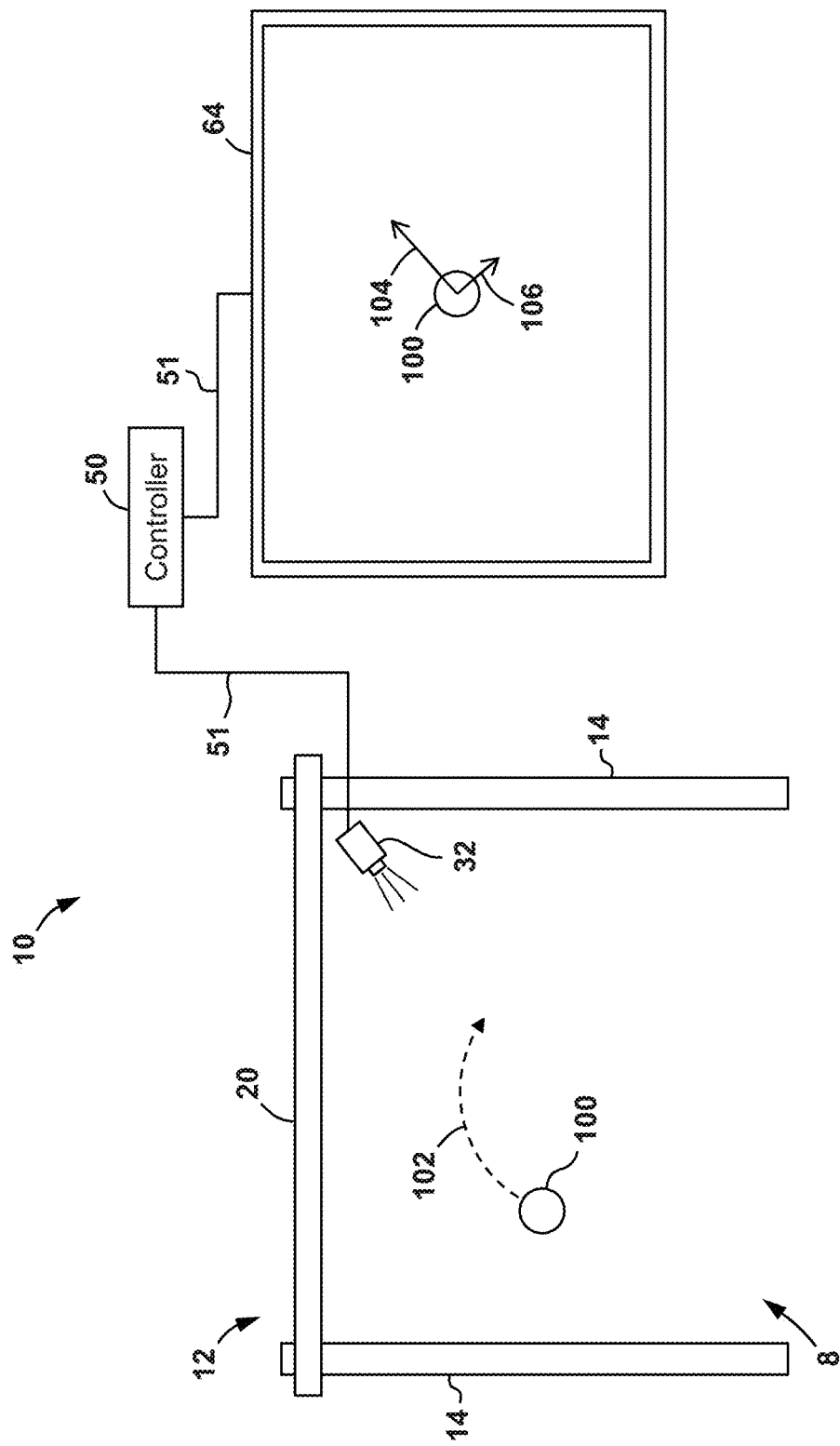
FIGS. 2-4 are schematic representations of the system of FIG. 1 analyzing, characterizing, and presenting different, exemplary physical phenomena.

Referring now to FIGS. 1 and 2, in some embodiments, an object 100 is moved within the active volume 8. The motion imparted to the object 100 may include linear and/or angular motion. In this example, the object 100 is moved along an arcuate path 102. As the object 100 moves within the active volume 8, controller 50 (e.g., camera tracking module 62) targets and tracks the object via camera 32. In addition, as previously described above, as the object 100 is moved within active volume, controller 50 (e.g., processor 52, camera tracking module 62, etc.) analyzes the motion and forces acting on the object 100, and then outputs a visual representation of the forces on display 64. For instance, controller 50 may provide all or a part of the output from camera 32 to display 64 such that a viewer can see the object 100 moving within active volume 8.

In addition, controller 50 can provide additional graphics that are overlaid on the image (e.g., still image, video, etc.) captured by camera 32 so as to visually depict one or more vectors 104, 106 associated with the motion of the object 100. Specifically, in the example of FIG. 2, display 64 depicts a first vector 104 representing the velocity vector 104 for object 100, and a second vector 106 representing the angular acceleration vector for object 100. Controller 50 can present a still image including the vectors 104, 106 for a particular moment in time, or present a moving video (comprising a plurality of images) of the object 100 moving along arcuate path 102 and presenting the changing vectors 104, 106 (changing in direction and/or magnitude) for the object 100 throughout the displayed movement. Depending on the time required for processing and communication of the various signals and data within and between controller 50, camera 32, and display 64, in some embodiments, the depiction on display 64 occurs in substantially real-time with the actual movement of object 100 within active volume 8. Thus, during these operations, a viewer can actually see the forces and linear and/or angular velocities and accelerations acting on object 100 as it proceeds along the specific arcuate path 102.

Figure 3:
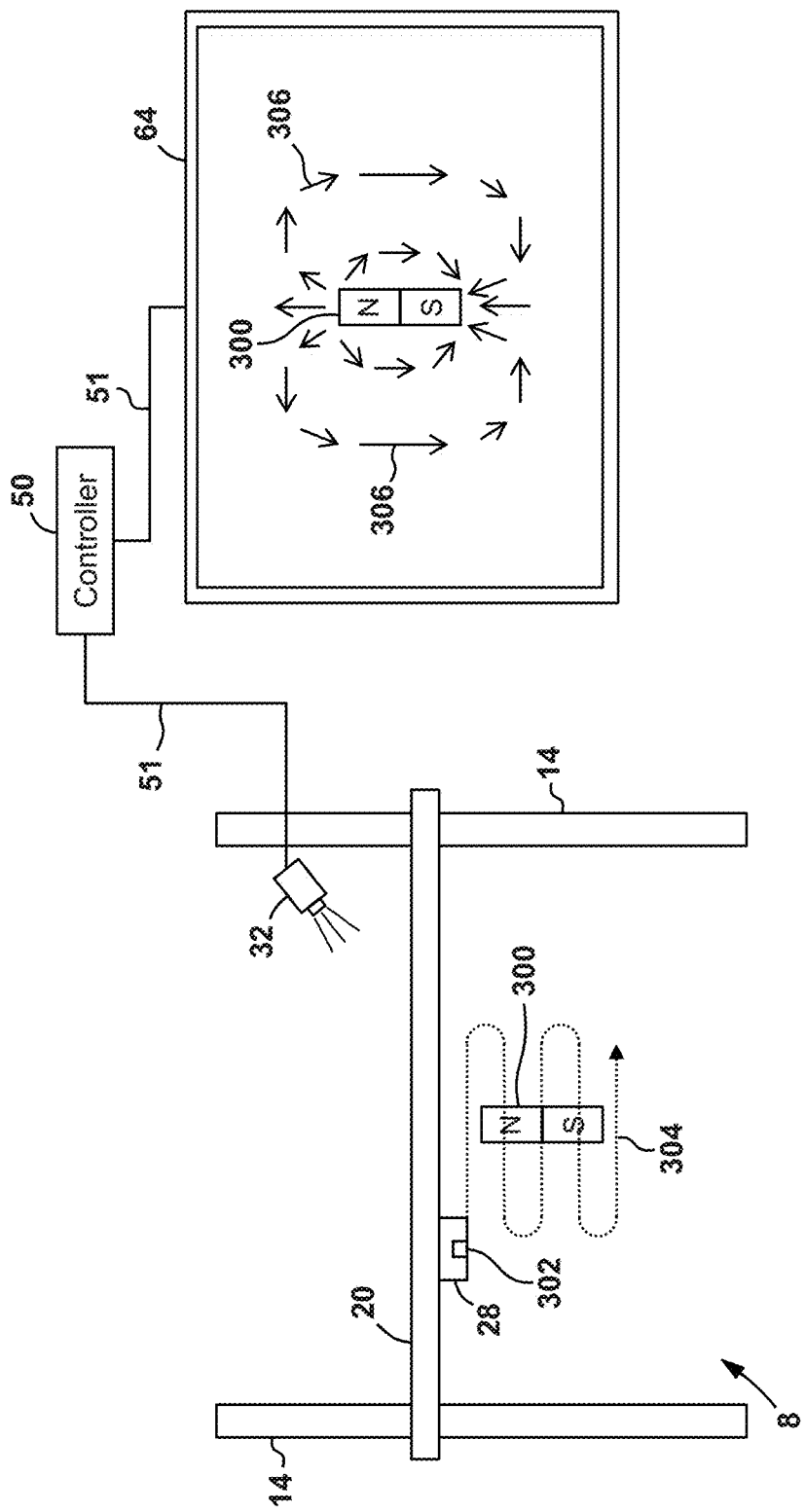

Referring now to FIGS. 1 and 3, in some embodiments, a magnetic or electric field of an object or system disposed within active volume 8 is scanned and visually represented via system 10. In particular, in some embodiments, a magnetic field of a magnet 300 (or other magnetic object or assembly) is scanned via sensor 302 mounted to probe 28. Sensor 302 may comprise any suitable device or array that is configured to detect or measure a magnetic field, including in some cases the magnitude and direction of magnetic field lines emitted from the magnetic object (e.g., a magnetometer).

During operations, probe 28 and sensor 302 are maneuvered along a predetermined path 304 over magnet 300 so as to allow sensor 302 to scan the magnetic field surrounding the magnet 300. The probe 28 and sensor 302 are maneuvered by actuating drivers 21, 23, 25 via controller 50 as previously described above. As the sensor 302 scans the magnetic field of magnet 300, the controller 50 processes the received data and outputs a visual representation of the magnetic field on display 64, external device 66, and/or some other device. As shown in FIG. 3, in some embodiments, the visual representation includes an image (or plurality of images) captured by camera 32 of the magnet 300 within active volume 8, along with some graphical representation of the scanned magnetic field surrounding the object, such as for instance, vectors 306 extending along the magnetic field lines of magnet 300. Thus, a viewer can see the magnetic field surrounding magnet 300 so as to provide a better understanding of such fields and their characteristics.

In some embodiments, the sensor 302 detects an electric field of an object within active volume 8. Thus, in these embodiments, sensor 302 is maneuvered about the object and controller 50 presents an image of the object with a visual representation of the electric field (e.g., via a plurality of vectors similar to vectors 306 of the magnetic field of magnet 300 shown in FIG. 3) on display 64 (or another display as previously described above). In these embodiments, the sensor 302 may comprise any suitable device or array configured to measure or detect an electric field.

Figure 4:
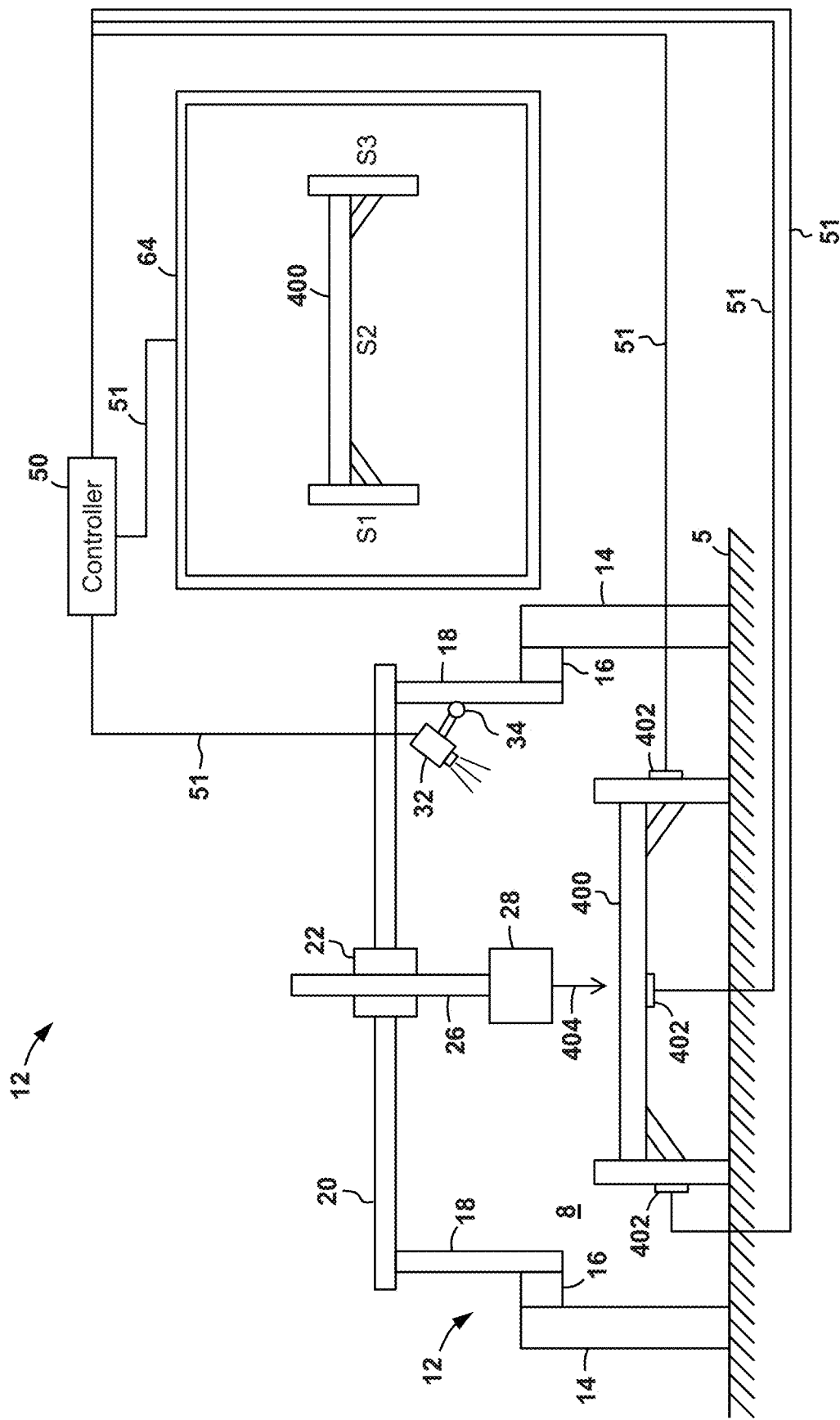
Figure 5:
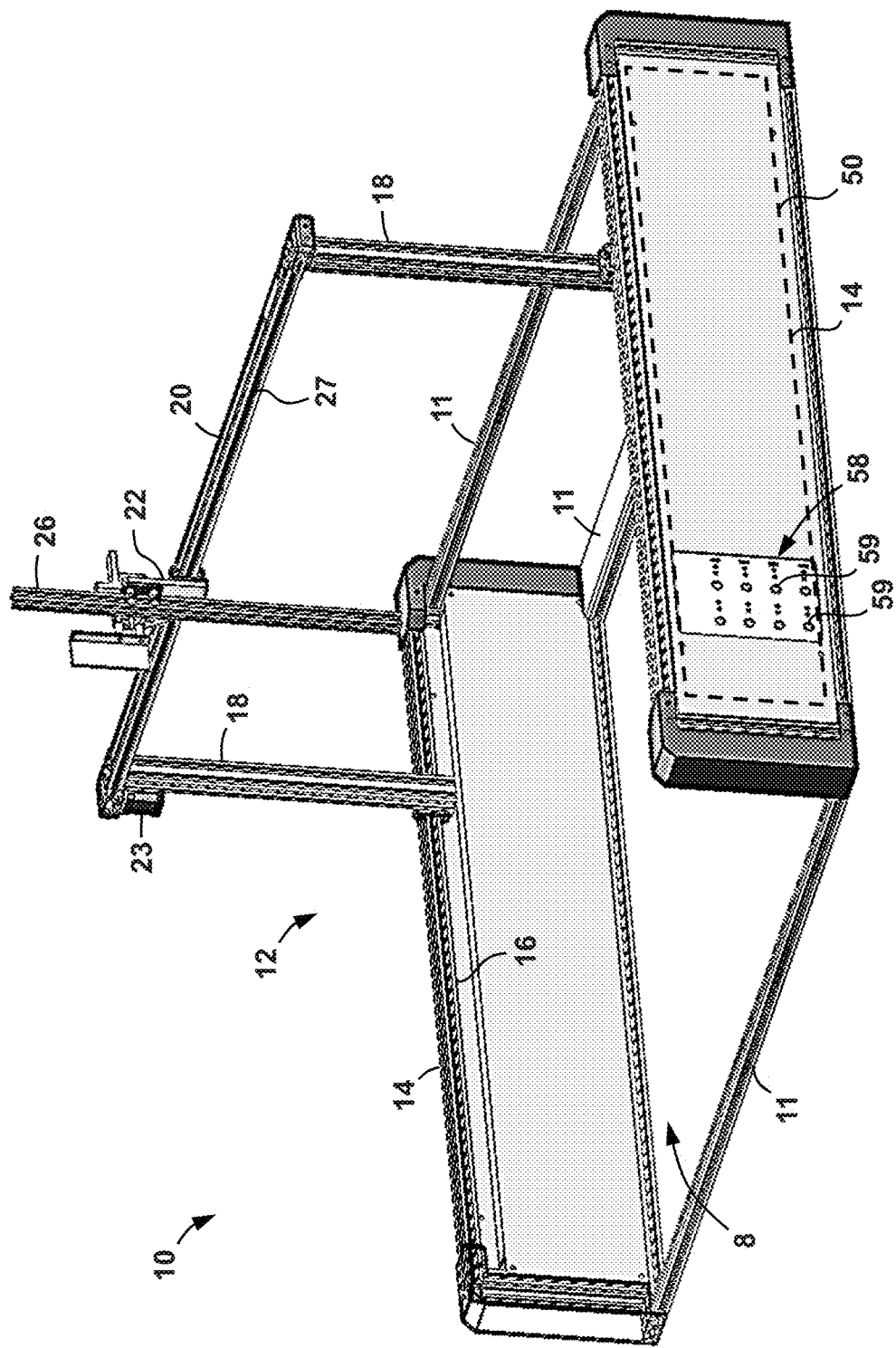
FIG. 5 is a perspective view of the frame of the system of FIG. 1.
Figure 6:
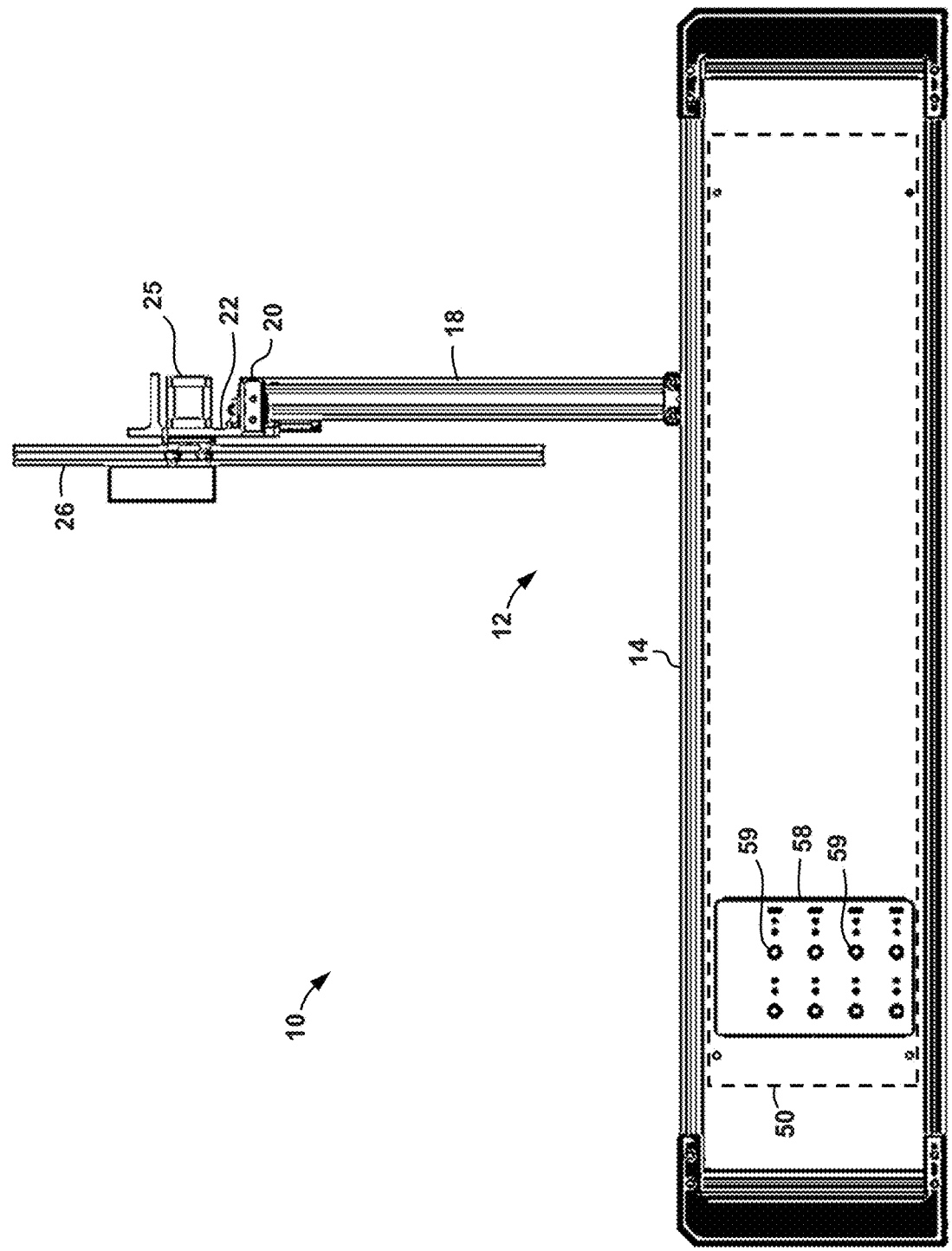
FIG. 6 is a side view of the frame of the system of FIG. 1.
Figure 7:
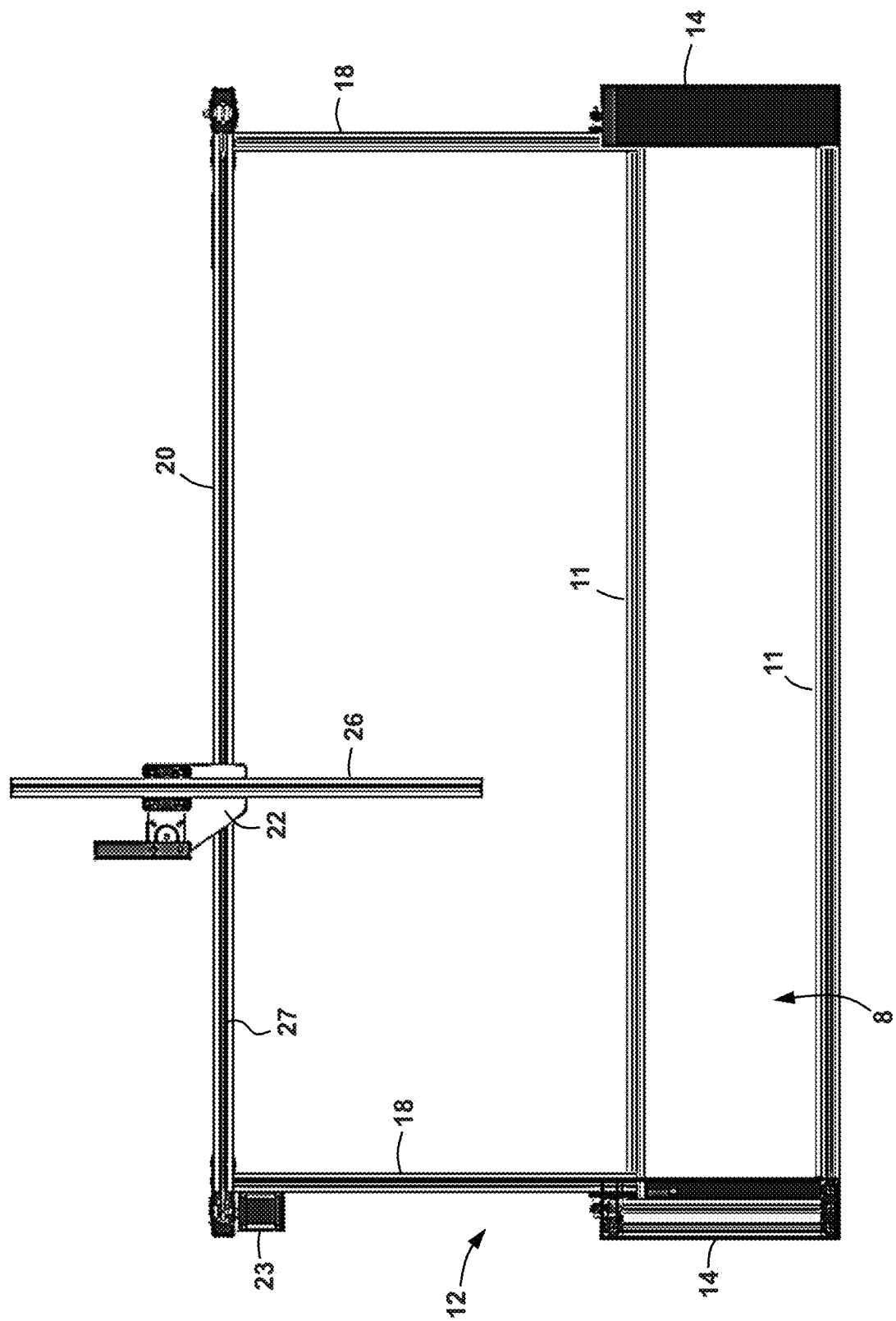
FIG. 7 is a front view of the frame of the system of FIG. 1.

Referring now to FIGS. 1 and 4, in some embodiments, the forces or strain within a structure 400 are characterized and visualized utilizing system 10. For instance, in this embodiment, structure 400 includes a model of a bridge; however, any other suitable object or structure may be analyzed in other embodiments. A plurality of strain gauges 402 are coupled to points of interest along bridge 400, and each of the gauges is coupled to controller 50. Specifically, as previously described above, each of the strain gauges 402 is coupled to a corresponding port 59 of data acquisition model 58 (see e.g., FIG. 1).

During operations, camera 32 captures image(s) (or moving video comprising a plurality of images) of bridge 400 that is then displayed on display 64 (or possibly a display of external device 66). In addition, the output from strain gauges 402 is presented on display 64 on top of the image at the respective locations of the gauges along bridge as strain values S1, S2, S3, etc. Additional force or loads may also be imparted to bridge 400 so as to show how the values of strain (e.g., measured at strain gauges 402) change as a result thereof. For instance, probe 28 can be maneuvered to engage with bridge 400 and impart a downward force 404. During this process, display 64 may show, in real-time or near real-time as previously described above, the changing values of strain (e.g., 51, S2, S3, etc.) as a result of the downward force 404. Thus, a viewer can see and therefore better understand how loads are distributed through bridge 400.

Referring now to FIGS. 5-8, an embodiment of system 10 is shown. Each of the previously described components of system 10 identified with the same reference numerals discussed above with respect to FIG. 1. As can be appreciated in FIGS. 5-8, in some embodiments, base members 14 are separated by a pair of spacers 11 extending or spanning therebetween. In addition, in some embodiments, controller 50 (or some components thereof) is mounted (at least partially) within one or both of the base members 14. Further, in this embodiment, ports 59 of data acquisition module 58 are disposed along a side of one of the base members 14 (e.g., the base member 14 carrying controller 50). It should be appreciated that some of the other components of system 10 (e.g., camera 32, probe 28, sensor 30, etc.) are not shown in FIGS. 5-8 for purposes of clarity.

Embodiments disclosed herein include systems and associated methods for analyzing, characterizing, and presenting various physical phenomena for physical structures, objects, etc. Specifically, the use of the systems disclosed herein may allow such physical phenomena to be analyzed and depicted such that a viewer may quickly and easily ascertain the nature and application of these phenomena as related to an object or objects of interest. As a result, the explanation, teaching, or analysis of these physical phenomena may be more easily accomplished.

While exemplary embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the disclosure. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A system for characterizing physical phenomena, the system comprising:
    a frame defining an active volume;
    a camera configured to capture an image of the active volume;
    a controller coupled to the camera, wherein the controller is configured to:
        track an object within the active volume via the camera;
        analyze a motion of the object within the active volume; and
        output a visual depiction of the object and one or more vectors characterizing the motion of the object on a display
    a probe mounted to the frame; and
    a coordinate-measuring machine (CMM) coupled to the frame that is configured to move the probe within the active volume.

2. The system of claim 1, wherein the display is coupled to the frame.

3. The system of claim 1, wherein the visual depiction comprises an image of the object captured by the camera.

4. The system of claim 3, wherein the visual depiction comprises the one of more vectors presented on the image.

5. The system of claim 1, wherein the CMM comprises a plurality of drivers coupled to the frame that are configured to translate the probe within the active volume.

6. The system of claim 5, wherein the controller is configured to actuate the drivers.

7. The system of claim 6, comprising a sensor mounted to the probe.

8. The system of claim 7, wherein the sensor is configured to detect an electric field or a magnetic field.

9. The system of claim 8, wherein the controller comprises a data acquisition module that comprises a plurality of ports that are configured to couple with a plurality of sensors disposed within the active volume.

10. A system for characterizing physical phenomena, the system comprising:
    a frame defining an active volume;
    a camera configured to capture an image of the active volume;
    a sensor mounted to the frame;
    a coordinate-measuring machine (CMM) coupled to the frame that is configured to move the sensor within the active volume;
    a controller coupled to the camera, the CMM, and the sensor, wherein the controller is configured to:
        move the sensor within the active volume via the CMM;
        detect one of a magnetic or an electric field within the active volume via the sensor; and
        output a visual depiction of the one of the magnetic or the electric field on a display.

11. The system of claim 10, wherein the visual depiction comprises a plurality of vectors indicating field lines of the one of the magnetic or the electric field.

12. The system of claim 11, wherein the CMM comprises a plurality of drivers coupled to the frame.

13. The system of claim 12, wherein the controller is configured to actuate the drivers.

14. The system of claim 13, wherein the controller comprises a data acquisition module that comprises a plurality of ports that are configured to couple with a plurality of sensors disposed within the active volume.

15. A method of characterizing physical phenomena, the method comprising:
    (a) moving an object within an active volume, wherein the active volume is defined by a frame;
    (b) tracking the object with a camera; and
    (c) displaying a visual depiction of the object that includes one or more vectors characterizing a motion of the object within the active volume, wherein the one or more vectors comprise a first vector depicting a velocity of the object and a second vector depicting an acceleration of the object.

16. A method of comprising physical phenomena, the method comprising:
    (a) moving an object within an active volume, wherein the active volume is defined by a frame;
    (b) tracking the object with a camera;
    (c) displaying a visual depiction of the object that includes one or more vectors characterizing a motion of the object within the active volume;
    (d) moving a sensor within the active volume;
    (e) measuring a magnetic or an electric field within the active volume during (d); and
    (f) displaying a visual depiction of the magnetic or the electric field on the display.

17. The method of claim 16, wherein the visual depiction of the magnetic or the electric field comprises a plurality of vectors indicating field lines of the magnetic or the electric field.

18. A method of characterizing physical phenomena, the method comprising:
 (a) moving an object within an active volume, wherein the active volume is defined by a frame;
 (b) tracking the object with a camera;
 (c) displaying a visual depiction of the object that includes one or more vectors characterizing a motion of the object within the active volume;
 (d) measuring strain on a second object disposed within the active volume with a strain sensor coupled to a data acquisition module of the controller; and
 (e) displaying the measured strain on an image of the second object captured by the camera.

\* \* \* \* \*